United States Patent
Yew et al.

(10) Patent No.: US 6,228,742 B1
(45) Date of Patent: May 8, 2001

(54) METHOD OF FABRICATING SHALLOW TRENCH ISOLATION STRUCTURE

(75) Inventors: Tri-Rung Yew, Hsinchu Hsien; Water Lur, Taipei; Gwo-Shii Yang, Hsinchu, all of (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/264,692

(22) Filed: Mar. 8, 1999

(51) Int. Cl.[7] .................................................. H01L 21/76
(52) U.S. Cl. ............................ 438/400; 438/296; 438/435
(58) Field of Search ................................. 438/400, 425, 438/427, 431, 435, 513, 296, 426, 446, 782

(56) References Cited

U.S. PATENT DOCUMENTS

| | | | |
|---|---|---|---|
| 5,796,949 | * 11/1999 | Chen | 438/427 |
| 5,843,820 | * 12/1998 | Lu | 438/243 |
| 5,918,131 | * 6/1999 | Hsu et al. | 438/296 |
| 6,097,076 | * 8/2000 | Gonzalez et al. | 257/513 |

* cited by examiner

Primary Examiner—David Nelms
Assistant Examiner—Phuc T. Dang
(74) Attorney, Agent, or Firm—Blakely Sokoloff Taylor & Zafman

(57) ABSTRACT

A method of fabricating a shallow trench isolation structure is described. A mask layer is formed on the substrate. The mask layer and the substrate are patterned to form trenches in the substrate. The trenches comprise a smallest trench. A first isolation layer is formed on the mask layer to fill partially the trenches. A densification step is performed. A second isolation layer is formed on the first isolation layer to fill completely the trench. The first isolation layer and the second isolation layer are removed until the mask layer is exposed. The mask layer is removed.

14 Claims, 2 Drawing Sheets

METHOD OF FABRICATING SHALLOW TRENCH ISOLATION STRUCTURE

BACKGROUND OF THE INVENTION

1. Field of the Invention

The present invention relates to a semiconductor fabricating method. More particularly, the present invention relates to a method of fabricating an isolation region.

2. Description of the Related Art

An isolation region is formed in an integrated circuit for the purpose of separating neighboring device regions of a substrate and preventing the carriers from penetrating through the substrate to neighboring devices. In a dynamic random access memory (DRAM) device, for example, the field effect transistors (FETs) are isolated from each other by isolation regions in order to prevent current leakage among the FETs. Conventionally, local oxidation of silicon (LOCOS) technique is widely utilized in the semiconductor industry to provide isolation regions among the various devices in the substrate. Since the LOCOS technique has been used for quite a period of time, it is one of the most reliable and low-cost method for fabricating the device isolation regions. However, there are still some difficulties in the LOCOS process. These include internal stress generation and bird's beak encroachment. For a highly integrated device, the problem of bird's beak encroachment by the isolation regions is especially difficult to avoid. Thus the isolation regions cannot effectively isolate devices.

Shallow trench isolation (STI) technique is the other conventional method of forming isolation regions. An STI structure is formed by first anisotropically etching to form a trench in the substrate, and then depositing oxide in the trench to form an isolation region. Since an STI structure is scaleable and has no bird's beak encroachment problem as found in the conventional LOCOS technique, it has become widely used for forming sub-micron CMOS circuits.

However, some drawbacks still occur in the conventional STI structure. In the conventional STI fabrication process, a silicon oxide layer is formed to fill a trench after a liner layer is formed on the trench. A densification step is first performed at a high temperature and then a chemical-mechanical polishing step is performed to remove a portion of the silicon oxide. Or, the chemical-mechanical polishing step can be first performed and then the densification step is carried out. However, both of the above procedures form defects during the densification step. Because of the thermal expansion coefficient difference between the silicon substrate and the silicon oxide, the defects, such as defect lines, easily form in the substrate. Dislocation, which is one kind of defect line, commonly occurs. Once the dislocation extends into the source/drain region, dopants in the source/drain region easily diffuse along the dislocation. Thus, current leakage and bridging effects are likely to occur. The device quality thus is degraded. In a highly integrated circuit, the foregoing drawbacks become significantly serious and cause device failure, which degrades the product quality.

SUMMARY OF THE INVENTION

The invention provides a method of fabricating a shallow trench isolation structure. A mask layer is formed on the substrate. The mask layer and the substrate are patterned to form trenches in the substrate. The trenches comprise a smallest trench. A first isolation layer is formed on the mask layer to fill partially the trenches. A densification step is performed. A second isolation layer is formed on the first isolation layer to fill the trench. The first isolation layer and the second isolation layer are removed until the mask layer is exposed. The mask layer is removed.

In the step of forming the first isolation layer, because the trench is not fully filled, the trench opening is formed in the first isolation layer. In this manner, the stress, which is caused by the difference in thermal expansion coefficient between substrate and the first isolation layer, is released through the trench opening. The defect formation, the current leakage, and the bridging effect do not occur. The device failures do not happen, either. The product quality thus is improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
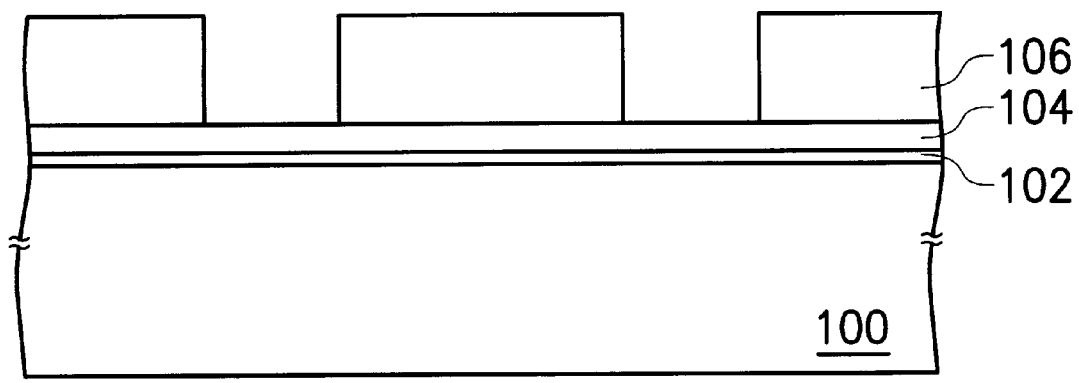
FIGS. 1A through 1F are schematic, cross-sectional views showing a method of fabricating a shallow trench isolation (STI) structure according to one embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1F are schematic, cross-sectional views showing a method of fabricating an STI structure according to one embodiment of the invention.

In FIG. 1A, a substrate 100, such as a silicon layer, is provided. A pad oxide layer 102 is formed on the substrate 100. The pad oxide layer 102 is used to protect the substrate 100. A mask layer 104 is formed on the pad oxide layer 102. The material of the mask layer 104 comprises silicon nitride. The mask layer 104 is formed by, for example, chemical vapor deposition. A patterned photoresist layer 106 is formed on the mask layer.

Figure 1B:
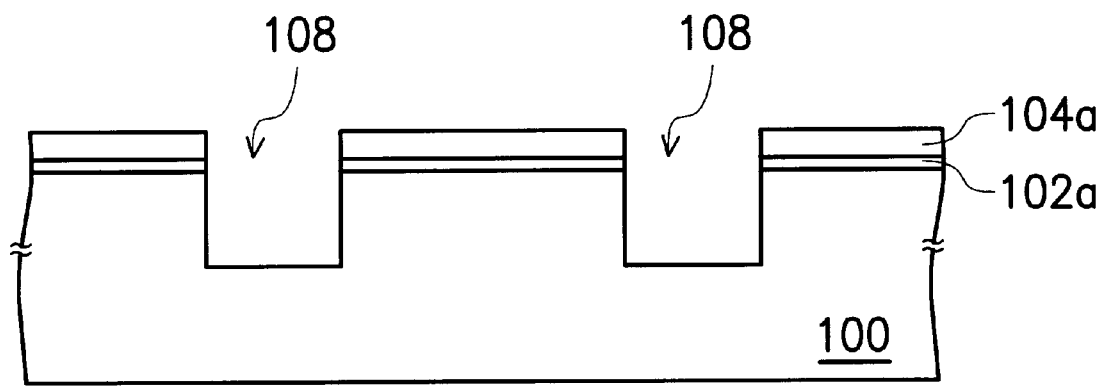

In FIG. 1B, an etching step is performed with the photoresist layer 106 serving as an etching mask. The mask layer 104 is etched to form a patterned mask layer 104a. The pad oxide layer 102 and the substrate 100 are etched with the mask layer 104a serving as a mask. A pad oxide layer 102a is formed. Trenches 108 comprising a smallest trench 108 are formed in the substrate 100. The photoresist layer 106 is removed.

Figure 1C:
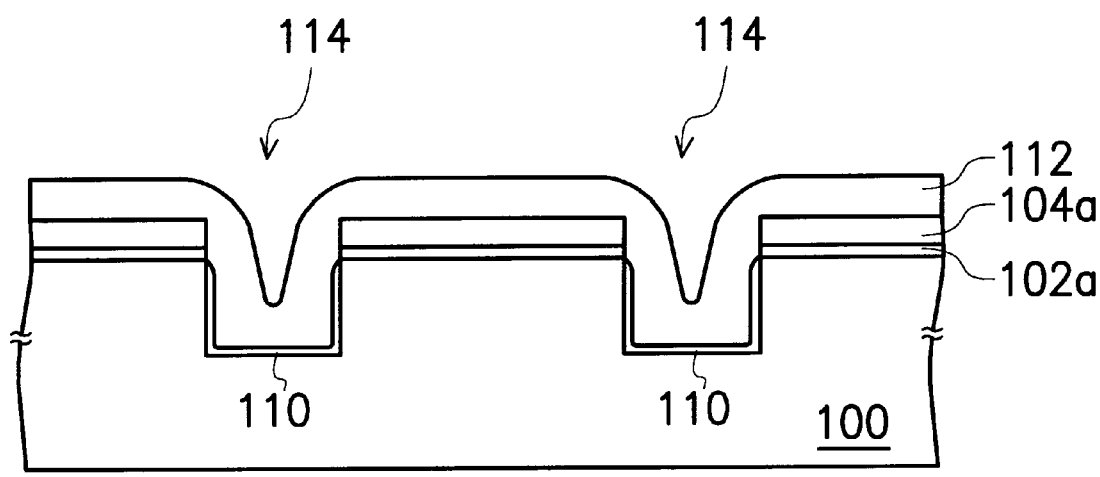

In FIG. 1C, a liner oxide layer 110 is formed on the substrate 100 exposed in the trenches 108. The liner oxide layer 110 is formed by, for example, thermal oxidation. A first isolation layer 112 is formed over the substrate to fill partially the trenches 108. The first isolation layer 110 is substantially conformal to the trenches 108. The thickness of the first isolation layer 112 preferably is between 100 angstroms and a half width of the smallest trench 108. A trench opening 114 is formed in the trenches 108. The material of the first isolation layer 112 comprises silicon oxide. The first isolation layer 112 preferably is formed by atmospheric-pressure chemical vapor deposition (APCVD), low-pressure chemical vapor deposition (LPCVD), or high-density plasma chemical vapor deposition (HDP-CVD). A densification step, such as an annealing step, is performed. The densification reduces interface charges and densifies the first isolation layer 112. The temperature of the densification step preferably is about 900° C. to 1200°C.

In the step of forming the first isolation layer 112, because the trench is not fully filled, the trench opening 114 is formed in the trench 108. In this manner, the stress, which is caused by the difference in thermal expansion coefficient between substrate 100 and the first isolation layer 112, is released through the trench opening. The defect formation, the current leakage, and the punch-thorough problem do not occur. The device failures do not happen, either. The product quality thus is improved.

Figure 1D:
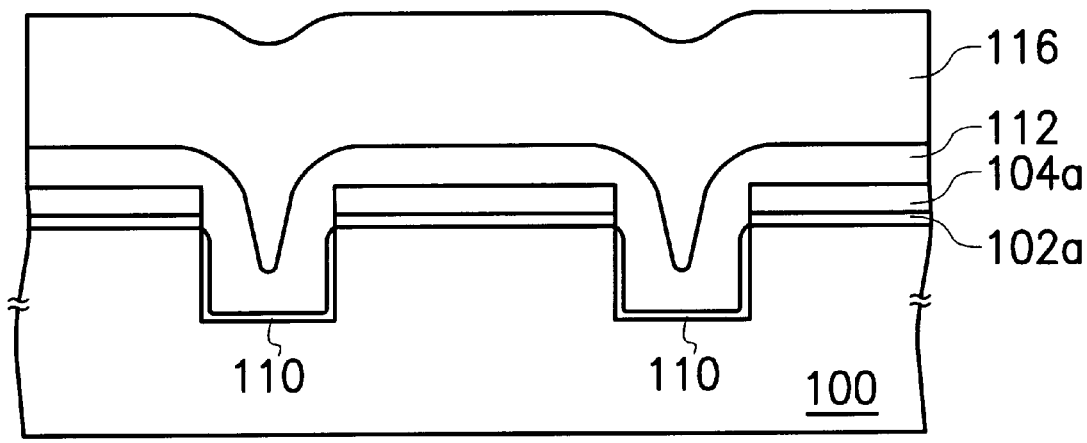

In FIG. 1D, a second isolation layer 116 is formed on the first isolation layer 112 to fill completely the trenches 108. The second isolation layer 116 is formed by, for example, atmospheric-pressure chemical vapor deposition, low-pressure chemical vapor deposition, or high-density plasma chemical vapor deposition (HDP-CVD).

Figure 1E:
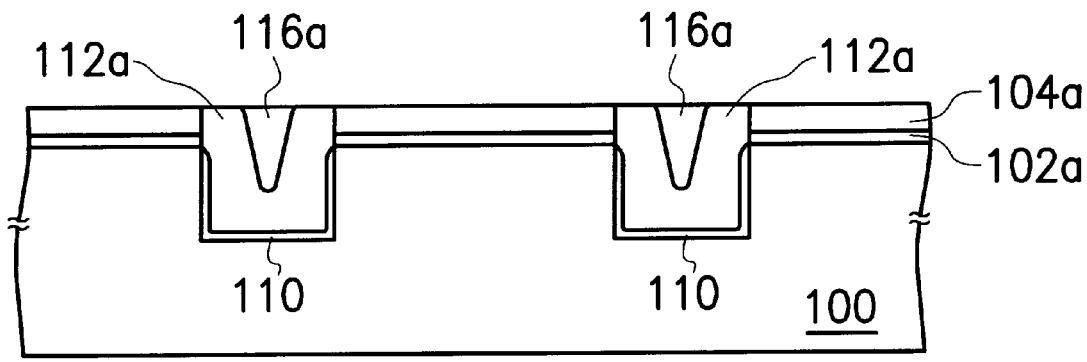

In FIG. 1E, a portion of the first isolation layer 112 and the second isolation layer 116 are removed by, for example, chemical-mechanical polishing with the mask layer 104a serving as a etching stop. A first isolation layer 112a, which remains from the first isolation layer 112, is formed. A second isolation layer 116a, which remains from the second isolation layer 116, is formed. Besides, the first isolation layer 112 and the second isolation layer 116 on the mask layer can also be removed by performing chemical-mechanical polishing together with etching to form the first isolation layer 112a and the second isolation layer 116a.

Figure 1F:
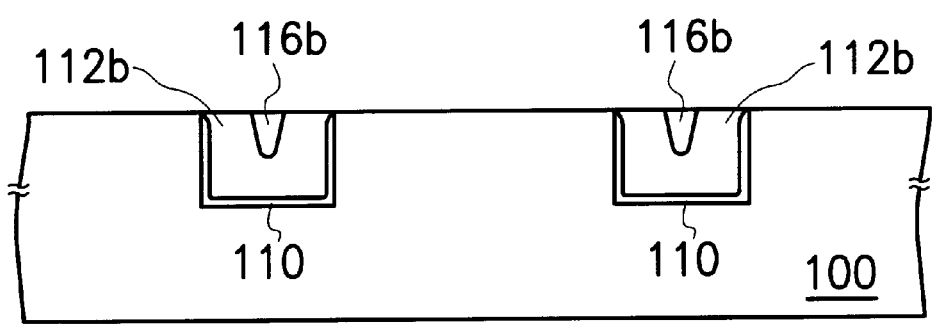

In FIG. 1F, the mask layer 104a is removed with a $H_3PO_4$ solution. The pad oxide layer 102a is removed. Meanwhile, a portion of the first isolation layer 112a and the second isolation layer 116a are removed to form a first isolation layer 112b and a second isolation layer 116b. An STI structure is formed.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a shallow trench isolation structure, comprising steps of:
    forming a pad oxide layer on the substrate;
    forming a mask layer on the pad oxide layer;
    patterning the mask layer, the pad oxide layer, and the substrate to form trenches in the substrate, wherein the trenches comprise a smallest trench;
    forming a first isolation layer over the substrate to fill partially the trenches, wherein the first isolation layer is substantially conformal to the trenches;
    performing a densification step;
    forming a second isolation layer on the first isolation layer to fill completely the trench;
    removing a portion of the first isolation layer and the second isolation layer until the mask layer is exposed; and
    removing the mask layer and the pad oxide layer.

2. The method of claim 1, wherein a material of the first isolation layer comprises silicon oxide.

3. The method of claim 1, wherein the first isolation layer is formed by atmospheric-pressure chemical vapor deposition.

4. The method of claim 1 wherein the first isolation layer is formed by low-pressure chemical vapor deposition.

5. The method of claim 1, wherein the first isolation layer is formed by high-density plasma chemical vapor deposition.

6. The method of claim 1, wherein a material of the second isolation layer comprises silicon oxide.

7. The method of claim 1, wherein the second isolation layer is formed by atmospheric-pressure chemical vapor deposition.

8. The method of claim 1, wherein the second isolation layer is formed by low-pressure chemical vapor deposition.

9. The method of claim 1, wherein a thickness of the first isolation layer on a bottom of the trenches is between 100 angstroms and a half width of the smallest trench.

10. The method of claim 1, wherein the densification step comprises annealing.

11. A method of fabricating a shallow trench isolation structure, comprising:
    forming a pad oxide layer on a substrate;
    forming a mask layer on the pad oxide layer;
    patterning the mask layer, the pad oxide layer, and the substrate to form trenches in the substrate, wherein the trenches comprise a smallest trench;
    forming a conformal isolation layer over the substrate, wherein the conformal isolation layer is substantially conformal to the trenches with a thickness between 100 Angstroms and a half width of the smallest trench;
    performing densification;
    forming an isolation layer on the conformal isolation layer to completely fill the trench;
    planarizing the conformal isolation layer and the isolation layer until the mask layer is exposed; and
    removing the mask layer and the pad oxide layer.

12. The method of claim 11, wherein a material of the conformal isolation layer comprises silicon oxide.

13. The method of claim 11, wherein a material of the isolation layer comprises silicon oxide.

14. The method of claim 11, wherein the densification comprises annealing.

* * * * *